(12) United States Patent
Saino

(10) Patent No.: US 6,830,991 B2
(45) Date of Patent: Dec. 14, 2004

(54) METHOD OF MANUFACTURING A SEMICONDUCTOR DEVICE INCLUDING A GETTERING OPERATION

(75) Inventor: Kanta Saino, Tokyo (JP)

(73) Assignees: NEC Corporation (JP); Hitachi, Ltd. (JP); NEC Electronics Corporation (JP)

(*) Notice: Subject to any disclaimer, the term of this patent is extended or adjusted under 35 U.S.C. 154(b) by 0 days.

(21) Appl. No.: 10/187,825

(22) Filed: Jul. 2, 2002

(65) Prior Publication Data

US 2003/0017682 A1 Jan. 23, 2003

(30) Foreign Application Priority Data

Jul. 4, 2001 (JP) ........................................ 2001-203560

(51) Int. Cl.[7] ............................................ H01L 21/322
(52) U.S. Cl. ..................................................... 438/476
(58) Field of Search ........................................ 438/476

(56) References Cited

U.S. PATENT DOCUMENTS 5,874,325 A * 2/1999 Koike .......................... 438/143
6,376,336 B1 * 4/2002 Buynoski ..................... 438/476

OTHER PUBLICATIONS

IBM Technical Disclosure Bulletin, 1978.*
IBM Technical Disclosure Bulletin, Nov., 1972.*
Wolf and Tauber, "Silicon Processing For the VLSI Era", vol. 1, Chapter 6, p. 175–181, Lattice Press (1986).*

* cited by examiner

Primary Examiner—David A. Zarneke
Assistant Examiner—Asok Kumar Sarkar
(74) Attorney, Agent, or Firm—Hayes Soloway P.C.

(57) ABSTRACT

A gettering layer for capturing heavy metal impurities is formed on a wafer back surface. Immediately before formation of a metal wiring layer, a semiconductor device is subjected to first heat treatment at a predetermined temperature so that the heavy metal impurities are heat-diffused and captured in the gettering layer. The gettering layer with the heavy metal impurities captured therein is removed before second heat treatment following the first heat treatment. After removing the gettering layer, a first amorphous silicon layer as a filler for filling a contact hole is deposited on a wafer device surface including a device active region while a second amorphous silicon layer having an impurity concentration equal to that of the first amorphous silicon layer is simultaneously deposited on the wafer back surface.

6 Claims, 4 Drawing Sheets

METHOD OF MANUFACTURING A SEMICONDUCTOR DEVICE INCLUDING A GETTERING OPERATION

BACKGROUND OF THE INVENTION

This invention relates to a method of manufacturing a semiconductor device and, in particular, to a method of manufacturing a semiconductor device which includes a gettering operation of removing heavy metal impurities unintentionally introduced into a silicon wafer in a semiconductor manufacturing process.

In a manufacturing process of a semiconductor device, a silicon wafer is often contaminated, for example, in an ion implanting step or an etching step in which heavy metal impurities may unintentionally be introduced onto a wafer device surface or into the interior of the silicon wafer. In the instant specification, the wafer device surface is intended to represent a principal surface of the silicon wafer which is adjacent to a device active region.

It is known that presence of such heavy metal impurities in the device active region will cause various problems, such as a low reliability of a gate insulator film of a MOS (Metal-Oxide-Semiconductor) transistor and a large junction leakage current. Particularly, in a DRAM (Dynamic Random Access Memory), an increase in junction leakage current due to the presence of the heavy metal impurities deteriorates refreshing characteristics. This results in a decrease in production yield and an increase in production cost. Therefore, in order to suppress the production cost, it is necessary to efficiently remove the heavy metal impurities without complicating the manufacturing process.

In order to remove the heavy metal impurities unintentionally introduced into the silicon wafer, a gettering technique is used. In the gettering technique, the heavy metal impurities are emitted from the device active region of the semiconductor device and captured in an inactive region which does not affect device characteristics.

As the gettering technique, various methods are known. As a method in which a gettering layer is formed on a wafer back surface opposite to the wafer device surface, following two methods are known.

A first method is a phosphorus diffusion method in which a high concentration of phosphorus is doped into the wafer back surface to capture the heavy metal impurities. In this method, a higher concentration of phosphorus generally provides a higher gettering ability.

A second method is a PBS (Polysilicon Back Sealing) method in which polysilicon is deposited on the wafer back surface. In the second method, the heavy metal impurities are captured in grain boundaries of polysilicon. A smaller grain size of polysilicon provides a greater effective gettering area so that a gettering operation is more efficiently performed.

In each of the first and the second methods mentioned above, heat treatment is performed so that the heavy metal impurities are heat-diffused from the device active region to the wafer back surface and captured in the gettering layer formed on the wafer back surface. As a consequence, the heavy metal impurities contained in the device active region adjacent to the wafer device surface are reduced. Therefore, the gettering effect greatly depends upon the temperature and the time of the heat treatment upon the gettering operation.

Generally, the gettering operation is performed by three steps. A first step is emission of the heavy metal impurities from the device active region. A second step is heat diffusion of the heavy metal impurities to the gettering layer. A third step is capture of the heavy metal impurities in the gettering layer.

In the first step, the emission of the heavy metal impurities occurs at the highest temperature of the heat treatment. Generally, the heavy metal impurities are efficiently emitted at a temperature not lower than 800° C.

In the second step, the heavy metal impurities must be diffused to the wafer back surface where the gettering layer is present. Therefore, it is preferable to perform the heat treatment at a high temperature so that the diffusion length or distance of the heavy metal impurities is increased. For example, in case where the heat treatment is performed at 800° C. for one hour, the diffusion length of an iron (Fe) atom (heavy metal impurity) in silicon is equal to 0.11 cm which approximately corresponds to twice the thickness (600 $\mu$m) of the silicon wafer. Therefore, the heat diffusion assures that the heavy metal impurities reach the gettering layer on the wafer back surface. Thus, in the gettering operation, the heavy metal impurities can be efficiently removed by the heat treatment at a temperature not lower than 800° C.

Referring to FIGS. 1, 2A and 2B, an existing method of producing a semiconductor device will be described.

Referring to FIG. 1, a semiconductor device comprises a silicon wafer 1 with a plurality of MOS transistors 27 formed in a device active region adjacent to a wafer device surface. Each of the MOS transistors 27 comprises a gate insulator film 4, a gate electrode 5, a source 6, and a drain 7. The MOS transistors 27 are isolated from one another by a device isolation oxide film 3.

Above the MOS transistors 27 and the device isolation oxide film 3, a polycide bit line 9 made of a polycide film is formed. Above the polycide bit line 9, a capacitor 28 is formed. The capacitor 28 comprises a capacitor lower electrode 11, a capacitor plate 13, and a capacitor nitride film 12 interposed between the capacitor lower electrode 11 and the capacitor plate 13. The MOS transistors 27, the polycide bit line 9, and the capacitor 28 are separated from one another by an interlayer insulator film 14.

The source 6 of each MOS transistor 27 is connected to the polycide bit line 9 through a bit contact 8 formed in the interlayer insulator film 14. The drain 7 of each MOS transistor 27 is connected to the capacitor lower electrode 11 through a capacitor contact 10 formed in the interlayer insulator film 14.

On the other hand, the silicon wafer 1 is provided with a gettering layer formed on a wafer back surface opposite to the wafer device surface. The gettering layer comprises a high-concentration phosphorus diffusion layer, a PBS layer, or the like. In FIG. 1, the device active region of the silicon wafer 1 contains heavy metal impurities 15 which have unintentionally been introduced in a preceding manufacturing step such as ion implantation.

In the semiconductor device having the above-mentioned structure, a gettering operation is carried out by a heat-treating step executed immediately before formation of a metal wiring layer, such as an aluminum (Al) wiring layer or a tungsten wiring layer, used as a circuit wiring.

In the heat-treating step, the semiconductor device is subjected to a heat treatment temperature of about 800° C. so that the heavy metal impurities 15 present in the device active region of the silicon wafer 1 are emitted from the device active region (FIG. 2A). The heavy metal impurities 15 are diffused to and captured in the gettering layer 2 on the wafer back surface of the silicon wafer 1 (FIG. 2B). It is thus possible to remove the heavy metal impurities 15 which have been introduced into the silicon wafer 1 in the manufacturing step preceding the gettering operation and which are present in the device active region.

Generally, in manufacturing steps after the formation of the metal wiring layer made of a metal such as aluminum, the heat treatment temperature is limited to about 400° C. or lower (otherwise, the metal such as aluminum is melted, resulting in deformation or short-circuiting). In this connection, re-emission or re-diffusion of the heavy metal impurities 15 out of the gettering layer 2 hardly occurs. Therefore, if the gettering operation is carried out prior to the formation of the circuit wiring, the heavy metal impurities can effectively be removed.

The existing method described above is a process assuming the use of relatively high temperature heat-resistant materials, such as polycide as the bit line and the nitride film as the capacitor dielectric film of the capacitor. Thus, the existing method does not envisage a low-temperature process which will be essential in the future.

In the field of LSI, development is continuously made of miniaturization of a device and a highly-integrated structure. For a DRAM or a embedded DRAM semiconductor device, it is proposed to use a metal such as tungsten as the bit line (metal bit line) and to adopt a capacitor having a MIM (Metal-Insulator-Metal) structure in which a metal such as ruthenium is used as the capacitor storage electrode film and the capacitor plate electrode.

In a process for manufacturing the semiconductor device of the above-mentioned structure, a heat treatment temperature as a process temperature applied in each of the manufacturing steps after the formation of the bit line or the capacitor must be limited to a temperature lower than that presently used of about 800° C., in order to reduce a metal contact resistance and a capacitor film leakage current.

However, a lower process temperature is associated with a lower heat treatment temperature to be applied in the gettering operation. This means that the emission and the diffusion of the heavy metal impurities during the gettering operation are difficult to occur.

Thus, in the method of manufacturing the semiconductor device with a lower process temperature, the gettering operation can not efficiently be carried out. This makes it difficult to remove the heavy metal impurities from the device active region.

SUMMARY OF THE INVENTION

It is therefore an object of this invention to provide a method of manufacturing a semiconductor device, such as a DRAM, having a metal bit line or a capacitor of a MIM structure, which is capable of efficiently carrying out a gettering operation without complicating a manufacturing process.

According to this invention, there is provided a method of manufacturing a semiconductor device, including a gettering operation of removing heavy metal impurities unintentionally introduced into a wafer in a manufacturing process, the method comprising the steps of:

preliminarily forming a gettering layer for capturing the heavy metal impurities on a wafer back surface opposite to a device active region;

carrying out, immediately before formation of a metal wiring layer, first heat treatment upon the semiconductor device at a predetermined temperature so that the heavy metal impurities are heat-diffused and captured in the gettering layer; and removing, before a second heat treatment following the first heat treatment, the gettering layer with the heavy metal impurities captured therein.

After the gettering layer is removed, a first amorphous silicon layer is deposited on a wafer device surface including the device active region to serve as a filler for filling a contact hole formed in an interlayer insulator film to connect the metal wiring layer with an element formed in the device active region. A second amorphous silicon layer having an impurity concentration equal to that of the first amorphous silicon layer is simultaneously deposited on the wafer back surface.

Preferably, an impurity contained in each of the first and the second amorphous silicon layers is phosphorus. The impurity concentration preferably falls within a range between $1\times10^{19}/cm^3$ and $5\times10^{20}/cm^3$.

The gettering layer is a phosphorus diffusion layer or a PBS layer in which polysilicon is deposited.

In the above-mentioned method of manufacturing the semiconductor device, the semiconductor device is subjected to the first heat treatment at the predetermined temperature immediately before formation of the metal wiring layer so that the heavy metal impurities are heat-diffused and captured in the gettering layer preliminarily formed on the wafer back surface. The gettering layer with the heavy metal impurities captured therein is removed before the second heat treatment following the first heat treatment. It is thus possible to prevent re-emission or re-diffusion of the heavy metal impurities.

After removing the gettering layer, the first amorphous silicon layer is deposited on the water device surface including the device active region to serve as the filler for filling the contact hole formed in the interlayer insulator film to connect the metal wiring layer and the element formed in the device active region. The second amorphous silicon layer having the impurity concentration equal to that of the first amorphous silicon layer is simultaneously deposited on the wafer back surface. Thus, the second amorphous silicon layer acts as another gettering layer for removing heavy metal impurities in subsequent steps after removing the gettering layer.

DESCRIPTION OF THE PREFERRED EMBODIMENT

Figure 1:
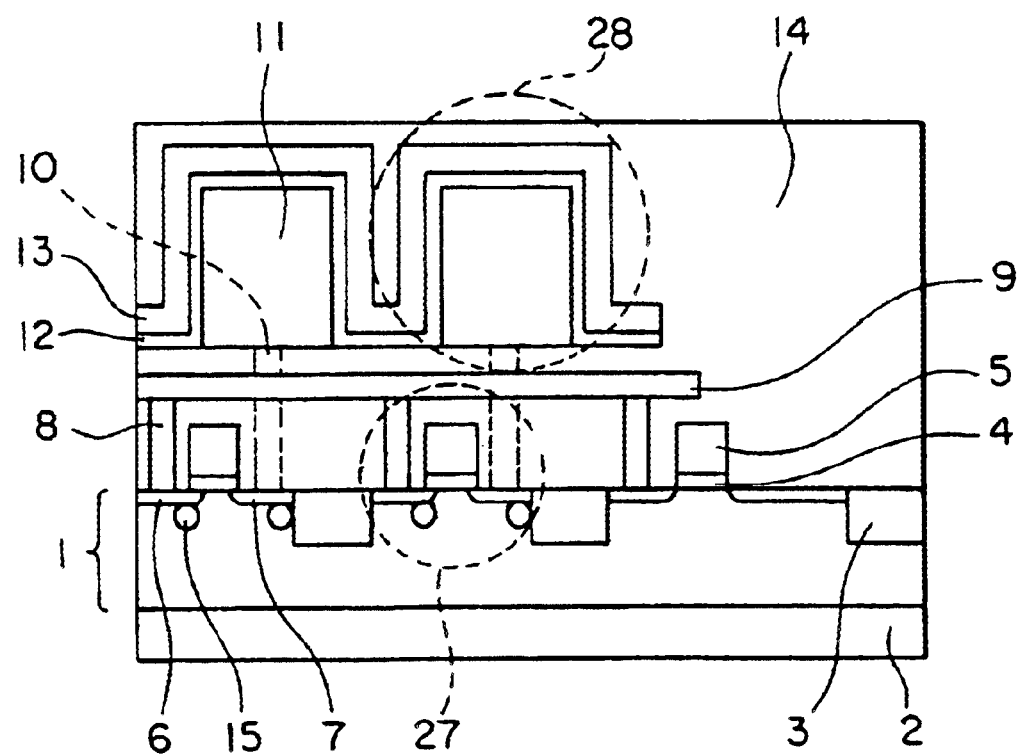
FIG. 1 is a sectional view of a typical semiconductor device.

Now, one embodiment of this invention will be described in detail with reference to the drawing.

In order to efficiently perform a gettering operation in a process of manufacturing a semiconductor device, such as a DRAM, having a metal bit line or a capacitor of a MIM structure, it is proposed to perform the gettering operation prior to formation of the metal bit line or the capacitor. However, after the formation of the metal bit line or the capacitor, various heat-treating steps, such as annealing of an interlayer insulator film and deposition of the interlayer insulator film by CVD (Chemical Vapor Deposition), are carried out. Those heat-treating steps are generally carried out at a heat treatment temperature within a range between 600 and 750° C. If the semiconductor device is subjected to such heat treatment temperature after the gettering operation, heavy metal impurities once captured in a gettering layer are partially re-emitted and re-diffused to a device active region adjacent to a wafer device surface of a silicon wafer. In this event, the gettering effect is lost.

In a method of manufacturing a semiconductor device according to this embodiment, the gettering operation is carried out immediately before formation of a metal bit line. After completion of the gettering operation, a gettering layer formed on the wafer back surface of the silicon wafer is removed to thereby prevent re-emission or re-diffusion of the heavy metal impurities.

In order to remove heavy metal impurities unintentionally introduced in subsequent steps, a high-concentration phosphorus diffusion layer or a PBS layer to act as another gettering layer is formed again on the wafer back surface. However, in order to suppress a production cost of the semiconductor device, it is not preferable to complicate the manufacturing process by addition of such a new step.

Taking the above into consideration, in the method of this embodiment, a step of filling phosphorus-doped polysilicon as a wiring member in a bit contact or a capacitor contact formed to connect a MOS transistor and a bit line or a capacitor includes deposition of a phosphorus-doped polysilicon layer on the wafer device surface and simultaneous deposition of a similar phosphorus-doped polysilicon layer on the water back surface.

Referring to FIGS. 3A through 3F, description will be made of a gettering operation in the method of this invention.

Figure 2A:
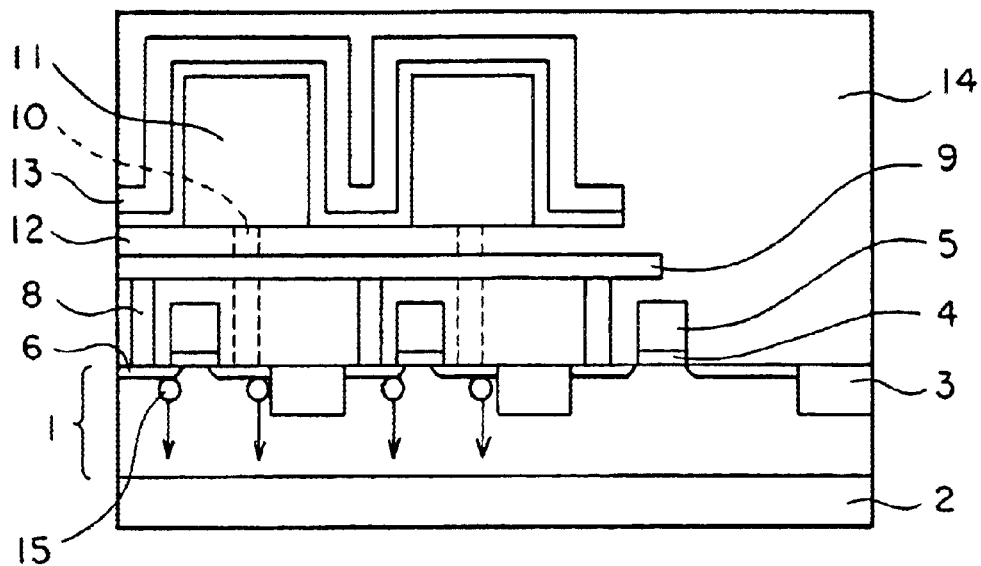
FIGS. 2A and 2B are sectional views for describing a gettering operation in an existing method of manufacturing a semiconductor device.
Figure 2B:
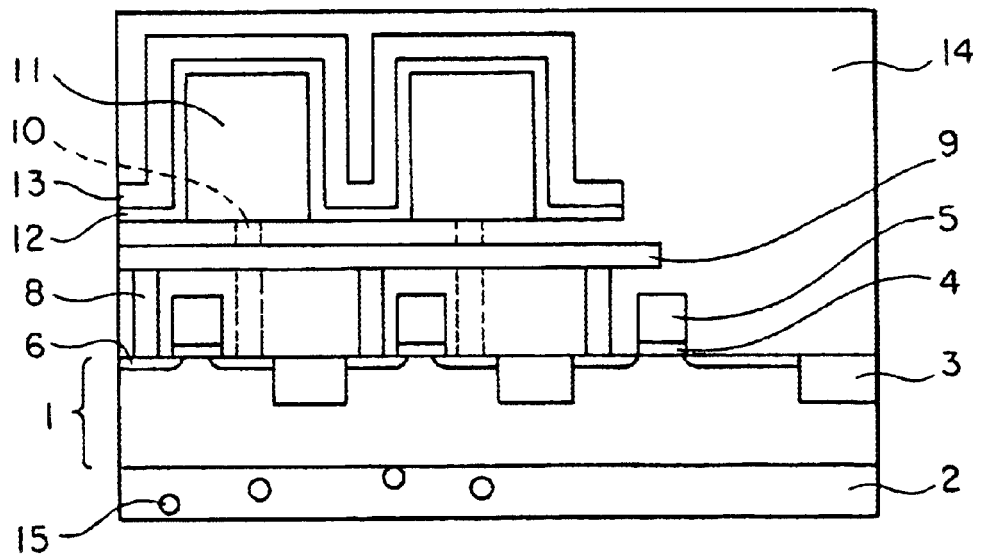

A semiconductor device illustrated in FIGS. 3A through 3F has a typical DRAM structure like the semiconductor device illustrated in FIGS. 1, 2A, and 2B. Similar parts are designated by like reference numerals. FIGS. 3A through 3F show those steps after completion of production of MOS transistors and immediately before formation of a bit line made of a metal (metal bit line).

Figure 3A:
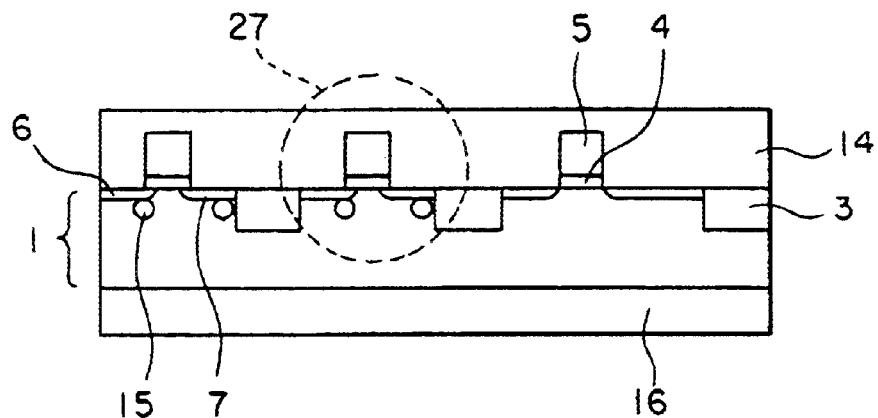
FIGS. 3A through 3F are sectional views for describing a gettering operation in a method of manufacturing a semiconductor device according to this invention.

At first referring to FIG. 3A, a silicon wafer 1 has a wafer back surface provided with a gettering layer which is a high-concentration phosphorus diffusion layer 16 doped with phosphorus at a high concentration of, for example, $1 \times 10^{19}/cm^3$. The silicon wafer 1 is provided with a plurality of MOS transistors 27 formed in a device active region adjacent to a wafer device surface. Each of the MOS transistors 27 includes a gate insulator film 4 comprising a silicon oxide film, a gate electrode 5 made of polycide, a source 6, and a drain 7. Each of the source 6 and the drain 7 is made of an impurity diffusion layer formed by ion implantation to be self-aligned to the gate electrode 5. The MOS transistors 27 are isolated from one another by a device isolation oxide film 3.

On the MOS transistors 27 and the device isolation oxide film 3, an interlayer insulator film 14 comprising, for example, a silicon oxide film is formed. Each of the device isolation oxide film 3 and the MOS transistors 27 is formed by a known technique.

In FIG. 3A, the device active region of the silicon wafer 1 contains heavy metal impurities 15 which have unintentionally been introduced in a preceding step, such as ion implantation. As described above, the semiconductor device illustrated in FIG. 3A is a DRAM immediately before formation of the metal bit line.

Figure 3B:
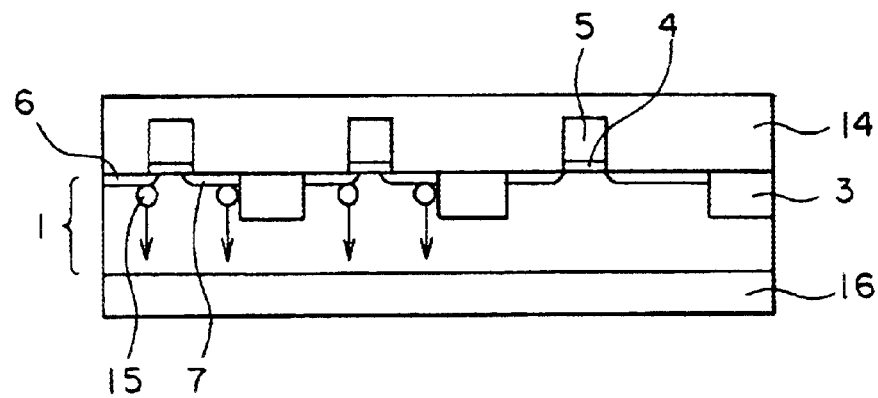
Figure 3C:
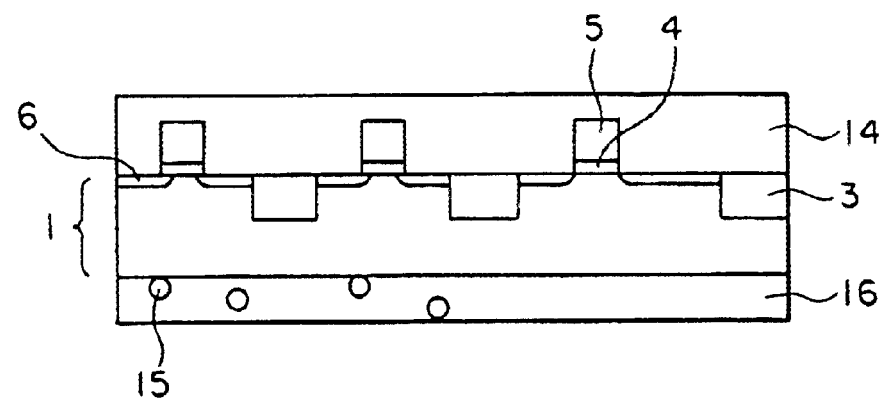

In the method of this embodiment, heat treatment at a temperature not lower than 800° C. is performed as a gettering operation immediately before the formation of the metal bit line. By the heat treatment, the heavy metal impurities 15 present near the wafer device surface of the silicon water 1 are emitted from the device active region and diffused towards the wafer back surface (FIG. 3B). The heavy metal impurities 15 are captured in the high-concentration phosphorus diffusion layer 16 as the gettering layer formed on the wafer back surface of the silicon wafer 1 (FIG. 3C).

Prior to this step, no metal layer, such as the metal bit line and a capacitor of a MIM structure such as low heat resistance material is not formed. Therefore, the heat treatment at a temperature not lower than 800° C. does not adversely affect device characteristics such as a metal contact resistance of a metal contact or a capacitor film leakage current.

Figure 3D:
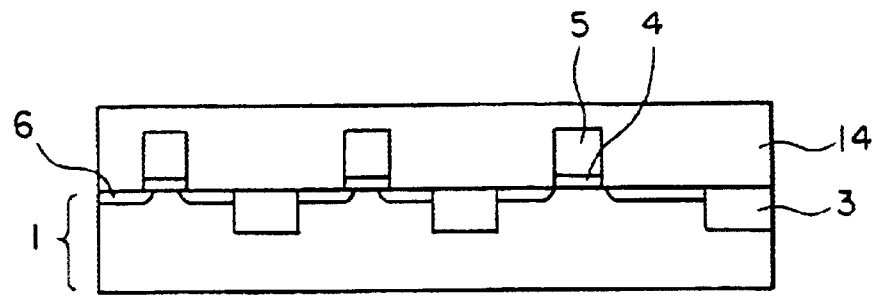

Next, the high-concentration phosphorus diffusion layer 16 as the gettering layer formed on the wafer back surface of the silicon wafer 1 is completely removed by wet etching, grinding, or the like (FIG. 3D).

By completely removing the high-concentration phosphorus diffusion layer 16, the heavy metal impurities 15 captured in the high-concentration phosphorus diffusion layer 16 are simultaneously removed. Therefore, in subsequent heat-treating steps, re-emission or re-diffusion of the heavy metal impurities 15 out of the high-concentration phosphorus diffusion layer 16 is not caused. Thus, the effect of the gettering operation illustrated in FIG. 3B is not lost.

Figure 3E:
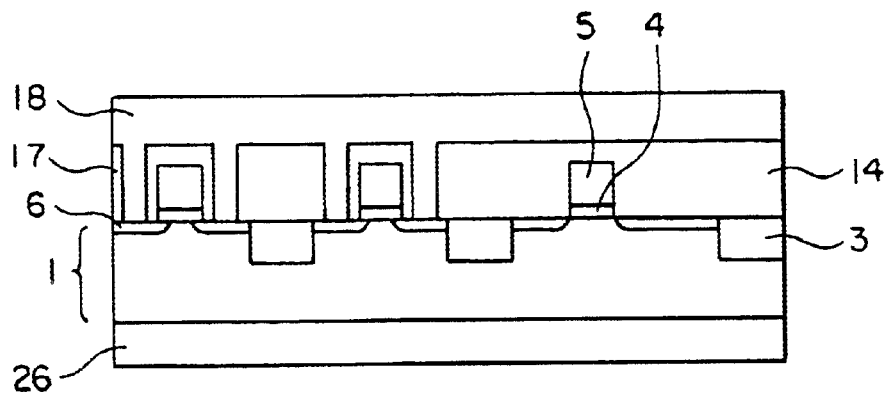

Then, as illustrated in FIG. 3E, a plurality of contact holes 17 for connection with an upper wiring layer (metal bit line or capacitor lower electrode) are formed in the interlayer insulator film 14 by photolithography and dry etching or the like.

Subsequently, by the use of LPCVD (low-pressure CVD), a first amorphous silicon layer 18 doped with phosphorus (P) is deposited on the wafer device surface of the silicon wafer 1 to serve as a filler for filling the contact holes 17. Simultaneously a second amorphous silicon layer 26 similar to the first amorphous silicon layer 18 is deposited on the wafer back surface of the silicon water 1. For example, each of the first and the second amorphous silicon layers 18 and 26 has a phosphorous concentration of $1 \times 10^{20}/cm^3$ and a thickness of 500 nm.

The second amorphous silicon layer 26 deposited on the wafer back surface of the silicon wafer 1 is not removed in subsequent steps but is left until completion of all manufacturing steps of the DRAM. Thus, the second amorphous silicon layer 26 acts as a new gettering layer. If the second amorphous silicon layer 26 has a phosphorus concentration equal to or greater than that of the high-concentration phosphorus diffusion layer 16 illustrated in FIG. 3A, a sufficient gettering ability is obtained. For example, the phosphorus concentration falls within a range between $1 \times 10^{19}/cm^3$ and $5 \times 10^{20}/cm^3$. If the phosphorus concentration is excessively high, growth failure may be caused during deposition. Therefore, it is desired that the phosphorus concentration is not greater than $5 \times 10^{20}/cm^3$.

Figure 3F:
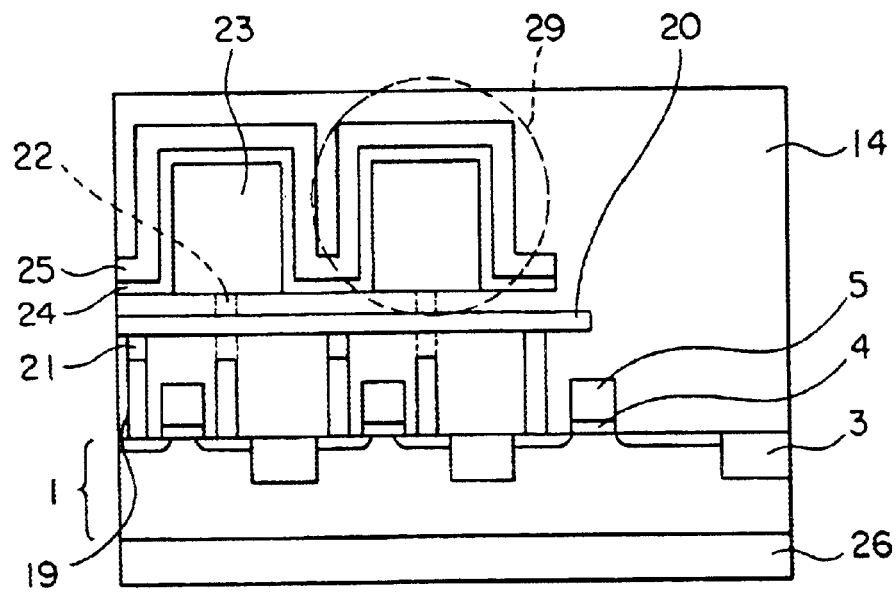

Then, as illustrated in FIG. 3F, the first amorphous silicon layer 18 on the wafer device surface of the silicon wafer 1 is removed except the interior of each contact hole 17 by dry etching or CMP (Chemical Mechanical Polishing). As a consequence, a contact plug 19 is left in each contact hole 17 and connected through a metal contact plug 21 to an upper wiring layer.

On the first amorphous silicon layer 18, a metal bit line 20, for example, made of tungsten (W), is formed as the upper wiring layer. Above the metal bit line 20, a capacitor 29 of a MIM structure (MIM capacitor) is formed. The capacitor 29 includes a metallic capacitor lower electrode 23 made of ruthenium (Ru), a metallic capacitor plate 25 made of ruthenium, and a capacitor dielectric film 24 comprising a tantalum oxide film ($Ta_2O_5$). The metal bit line 20 is connected through the metal contact plug 21 and the contact plug 19 to the source 6 of the MOS transistor 27. The metallic capacitor lower electrode 23 is connected through a capacitor contact (metal contact plug) 22 and the contact plug 19 to the drain 7 of the MOS transistor 27.

As described above, a process temperature must be lowered after the metal bit line 20 and the MIM capacitor 29 are formed. Therefore, a heat treatment temperature in each subsequent step is limited to a low temperature. Therefore, when the second amorphous silicon layer 26 deposited on the wafer back surface of the silicon wafer 1 is crystallized into polysilicon, the grain size is not excessively increased and grain boundaries are increased. Therefore, an effective gettering area is increased as compared with the high-concentration phosphorus diffusion layer 16. Thus, the gettering ability is improved as compared with the high-concentration phosphorus diffusion layer 16 so that the heavy metal impurities 15 are more efficiently removed.

Instead of the high-concentration phosphorus diffusion layer 16 used as the gettering layer in the gettering operation immediately before the metal bit line 20 is formed, a PBS layer may be formed on the wafer back surface of the silicon wafer 1. In this case also, a similar effect is obtained via the above-mentioned steps.

Thus, even in the manufacturing process of the semiconductor device such as the DRAM, i.e., in the manufacturing process requiring a low-temperature process, the heavy metal impurities unintentionally introduced can efficiently be removed. It is therefore possible to prevent an increase in junction leakage current and a decrease in refreshing characteristics. As a consequence, the production yield is improved and the production cost is lowered.

The second amorphous silicon layer 26 formed on the back surface of the silicon wafer 1 is deposited simultaneously when the first amorphous silicon layer 18 used as the filler for filling the contact hole is deposited on the device surface of the silicon wafer 1. Therefore, simply by incorporating the step of removing the gettering layer prior to formation of the metal bit line, the gettering effect can be improved without complicating the production process. As a consequence, the production yield is further improved and the production cost is further lowered.

Even if the contact plug 19 left after removing the first amorphous silicon layer 18 is crystallized (phosphorus-doped polysilicon) by activation of a dopant (phosphorus) or heat treatment for annealing the interlayer insulator film 14, the grain size is not excessively increased because the heat treatment temperature is not higher than 800° C. In this case, the second amorphous silicon layer 26 is simultaneously crystallized into polysilicon. However, the grain size is relatively small and the grain boundaries are increased. Therefore, the effective gettering area is increased so that the heavy metal impurities can efficiently be removed by the second amorphous silicon layer 26 as compared with the high-concentration phosphorus diffusion layer or the PBS layer.

In the foregoing, the method of this invention has been described in conjunction with the DRAM as the semiconductor device. However, this invention is applicable to any semiconductor device as far as the semiconductor device requires a low-temperature process in order to form a metal wiring layer.

In the foregoing, the gettering layer or the second amorphous silicon layer acting as a new gettering layer is doped with phosphorus (P). Alternatively, any other impurity may be doped as far as the heavy metal impurities in the silicon wafer can be captured.

With the above-mentioned structure, this invention exhibits the following effects.

Immediately before the formation of the metal wiring layer, the semiconductor device is subjected to the first heat treatment at a predetermined temperature so that the heavy metal impurities are heat-diffused and captured in the gettering layer preliminarily formed on the wafer back surface. The gettering layer with the heavy metal impurities captured therein is removed prior to the second heat treatment following the first heat treatment. In this manner, it is possible to prevent re-emission and re-diffusion of the heavy metal impurities. Therefore, even in the manufacturing process of the semiconductor device, such as the DRAM having the metal bit line or the MIM capacitor, i.e., the manufacturing process requiring the low-temperature process, the heavy metal impurities unintentionally introduced can efficiently be removed. It is consequently possible to reduce the junction leakage current and to improve the refreshing characteristics. As a consequence, the production yield is improved and the production cost is lowered.

After removing the gettering layer, the first amorphous silicon layer to serve as the filler for filling the contact hole formed in the interlayer insulator film to connect the metal wiring layer and an element formed in the device active region is deposited on the wafer device surface including the device active region while the second amorphous silicon layer equal in impurity concentration and in thickness to the first amorphous silicon layer is simultaneously deposited on the wafer back surface. The second amorphous silicon layer acts as a new gettering layer for removing heavy metal impurities in subsequent steps after removing the gettering layer. Thus, the production yield can be improved without complicating the production process so that the production cost can further be lowered.

Even if the contact plug left after removing the first amorphous silicon layer is crystallized by activation of the dopant (phosphorus) or the second heat treatment for annealing the interlayer insulator film, the grain size is not excessively increased because the heat treatment temperature is not higher than 800° C. In this case, the second amorphous silicon layer is simultaneously crystallized into polysilicon. However, the grain size is relatively small and the grain boundaries are increased. Therefore, the effective gettering area is increased so that the heavy metal impurities can efficiently be removed by the second amorphous silicon layer as compared with the high-concentration phosphorus diffusion layer or the PBS layer.

While this invention has thus far been disclosed in conjunction with several embodiments thereof, it will be readily possible for those skilled in the art to put this invention into practice in various other manners.

What is claimed is:

1. A method of manufacturing a semiconductor device, including a gettering operation of removing heavy metal impurities unintentionally introduced into a wafer in a manufacturing process, comprising the steps of:

forming a gettering layer for capturing heavy metal impurities on a wafer back surface opposite to a device active region;

carrying out a first heat treatment upon the semiconductor device at a predetermined temperature immediately before formation of a metal wiring layer so that the heavy metal impurities are heat-diffused and captured in the gettering layer; and removing the gettering layer with the heavy metal impurities captured therein before a second heat treatment following the first heat treatment.

2. A method as claimed in claim 1, further comprising the steps of:

depositing a first amorphous silicon layer to serve as a filler for filling a contact hole formed in an interlayer insulator film to connect a metal wiring layer and an element formed in the device active region on a wafer device surface including a device active region after removing the gettering layer; and simultaneously depositing a second amorphous silicon layer having an impurity concentration equal to that of the first amorphous silicon layer on the wafer back surface.

3. A method as claimed in claim 2, wherein:

an impurity contained in each of the first and the second amorphous silicon layers is phosphorus.

4. A method as claimed in claim 3, wherein:

the impurity concentration falls within a range between $1 \times 10^{19}/cm^3$ and $5 \times 10^{20}/cm^3$.

5. A method as claimed in claim 1, wherein:

the gettering layer is a phosphorus diffusion layer.

6. A method as claimed in claim 1, wherein:

the gettering layer is a PBS layer in which polysilicon is deposited.

* * * * *